United States Patent
Wu

(10) Patent No.: US 6,511,916 B1
(45) Date of Patent: Jan. 28, 2003

(54) METHOD FOR REMOVING THE PHOTORESIST LAYER IN THE DAMASCENE PROCESS

(75) Inventor: Chih-Ning Wu, Hsin-Chu (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 10/036,363

(22) Filed: Jan. 7, 2002

(51) Int. Cl.$^7$ .......................................... H01L 21/4763
(52) U.S. Cl. ...................................... 438/700; 438/623
(58) Field of Search ................................ 438/623, 624, 438/634, 637, 653, 675, 687, 694, 700, 706; 257/750, 759, 760

(56) References Cited

U.S. PATENT DOCUMENTS

| | | | | |
|---|---|---|---|---|
| 5,915,177 A | * | 6/1999 | Tseng et al. ................. | 438/264 |
| 6,147,005 A | * | 11/2000 | Tu et al. ...................... | 438/706 |
| 6,231,775 B1 | * | 5/2001 | Lenenson et al. ............. | 216/67 |
| 6,417,096 B1 | * | 7/2002 | Chen et al. .................. | 438/637 |
| 2002/0061649 A1 | * | 5/2002 | Nishida ....................... | 438/689 |

* cited by examiner

*Primary Examiner*—Long Pham
*Assistant Examiner*—Hsien-Ming Lee

(57) ABSTRACT

First of all, a semiconductor substrate having a dielectric layer thereon is provided. Then a photoresist layer is formed and defined on the dielectric layer. Afterward, an etching process is performed by way of using the photoresist layer as an etching mask to etch through the dielectric layer, so as to form a trench and a polymer layer on the photoresist layer. Subsequently, performing a removing process with two steps strips the photoresist layer and the polymer layer thereof, whereby this removing process with two steps can keep the trench profile and avoid the residues of the polymer layer.

13 Claims, 8 Drawing Sheets

METHOD FOR REMOVING THE PHOTORESIST LAYER IN THE DAMASCENE PROCESS

BACKGROUND OF THE INVENTION

1. Field of the Invention

The present invention relates generally to a process for manufacturing the dual damascene of semiconductor devices, and more particularly to remove the photoresist layers of the dual damascene.

2. Description of the Prior Art

When semiconductor devices of integrated circuits (IC) become highly integrated, the surface of the chips can not be supplied with enough area to make the interconnects. For matching the requirement of interconnects increases with Complementary Metal-Oxide-Semiconductor (CMOS) devices shrinks, many designs of the integrated circuit have to use dual damascene method. Moreover, it is using the three-dimensional structure of multi-level interconnects at present in the deep sub-micron region, and inter-metal dielectric (IMD) as the dielectric material which is used to separate from each of the interconnects. A conducting wire which connects between the upper and the lower metal layers is called the via plug in semiconductor industry. In general, if an opening, which forms in the dielectric layer exposure to devices of the substrate in, interconnects, it is called the contact hole.

It has two methods for conventional via and interconnect processes, one method is the via and interconnect finish by oneself, wherein the method is that the dielectric is first formed on the metal layer, and then the photoresist layer (PR) is defined on the dielectric, and use the etching process to make the via, and deposit conduction material in the via by means of deposition to finish the via process, then deposit and define metal layer, final, deposit the dielectric layer whereon. Conventional forming metal interconnect process is that make the via and the interconnect by means of two lithography process. Thus, it needs cumbrous steps of deposit and pattern. And yet, it will result in difficult patterned interconnects due to the multi layer connect layout is more daedal in the sub-quarter micron.

Therefore, damascene interconnect structure is developed at present. According to particulars of the process, it will compartmentalize three types, such as the single type, the dual type and the self-aligned type. The damascene is that etch the trench of interconnects in the dielectric, and then fill the metal as interconnect. This method can introduce metal that is difficult etched into the semiconductor without etching in the interconnect process. Therefore, this invention is the best method of the interconnect process in the sub-quarter micron.

The skill of the damascene is a method for forming via and interconnects. In the conventional damascene skill, the remainder of the organic polymer is formed on the photoresist layers after the etching process for forming the trenches. Conventional method for stripping the photoresist layers with the remainder of the organic polymer is plasma treatment with oxygen gas that can effectively strip the photoresist layer without remaining the polymer residues. However, it would induce the trench profile deformation, so that the trench 110 has a bowing profile 120, as shown in FIG. 1. The trench with the bowing profile 120 further leads to the poor deposition of the followed barrier metal and the physical vapor deposition (PVD) process with metal. Especially, in the Copper/chemical vapor deposition inorganic low-K damascene structure, the issues as above are more serious.

In accordance with the above description, a new and improved method for stripping the photoresist layer of the damascene process is therefore necessary, so as to raise the yield and quality of the follow-up process.

SUMMARY OF THE INVENTION

In accordance with the present invention, a new method for forming the damascene structure is provided that substantially overcomes drawbacks of above mentioned problems raised from the conventional methods.

Accordingly, it is an object of the present invention to provide a new method for stripping the photoresist layer of the damascene process, the present invention can remove the photoresist layer and the polymer residues thereof by a removing process with two steps, so as to avoid the remaining polymer residues and prevent the trench profile from deformation. Furthermore, the removing process with two steps of the present invention utilizes a mixing gas with CF4 to perform an ash process, so as to pre-remove the organic polymer from the surface of the photoresist layer. Then another ash process is performed by way of using another mixing gas with hydrogen to fully remove the photoresist layer. Hence, this invention can effectively raise the quality and the yield of the process, and it also can raise the capability for depositing the followed barrier metal and physical vapor deposition (PVD) process with metal to increase the performance of the device. Therefore, this invention corresponds to economic effect and utilization in industry, and it is appropriate for deep sub-micron technology.

In accordance with the present invention, a new method for removing the photoresist layer of the damascene process is disclosed. First of all, a semiconductor substrate having a dielectric layer thereon is provided. Then a photoresist layer is formed and defined on the dielectric layer. Afterward, an etching process is performed by way of using the photoresist layer as an etching mask to etch through the dielectric layer, so as to form a trench and a polymer layer on the photoresist layer. Subsequently, performing a removing process with two steps strips the photoresist layer and the polymer layer thereof, whereby this removing process with two steps can keep the trench profile and avoid the residues of the polymer layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
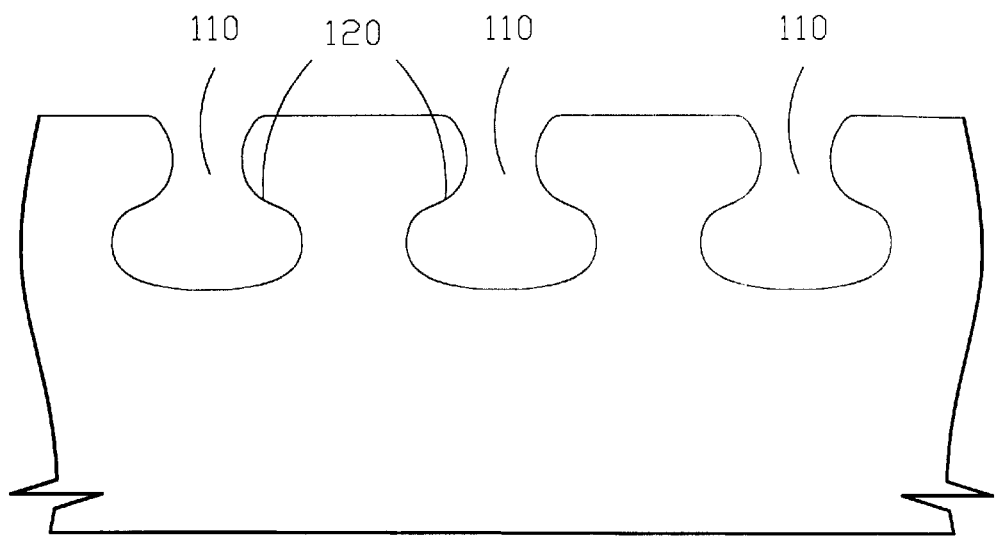
FIG. 1 shows cross-sectional views illustrative of the trench deformation that results from conventional process for removing the photoresist layer in the damascene process
Figure 2A:
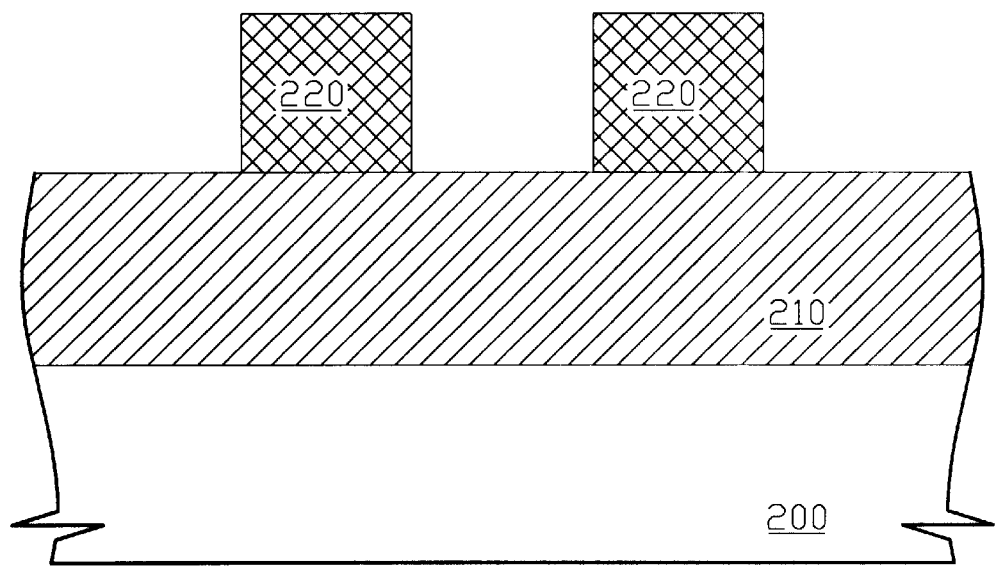
FIGS. 2A to 2D show cross-sectional views illustrative of various stages of the method for forming the trench by way of using the process for removing the photoresist layer with two steps in accordance with the first embodiment of the present invention.
Figure 2B:
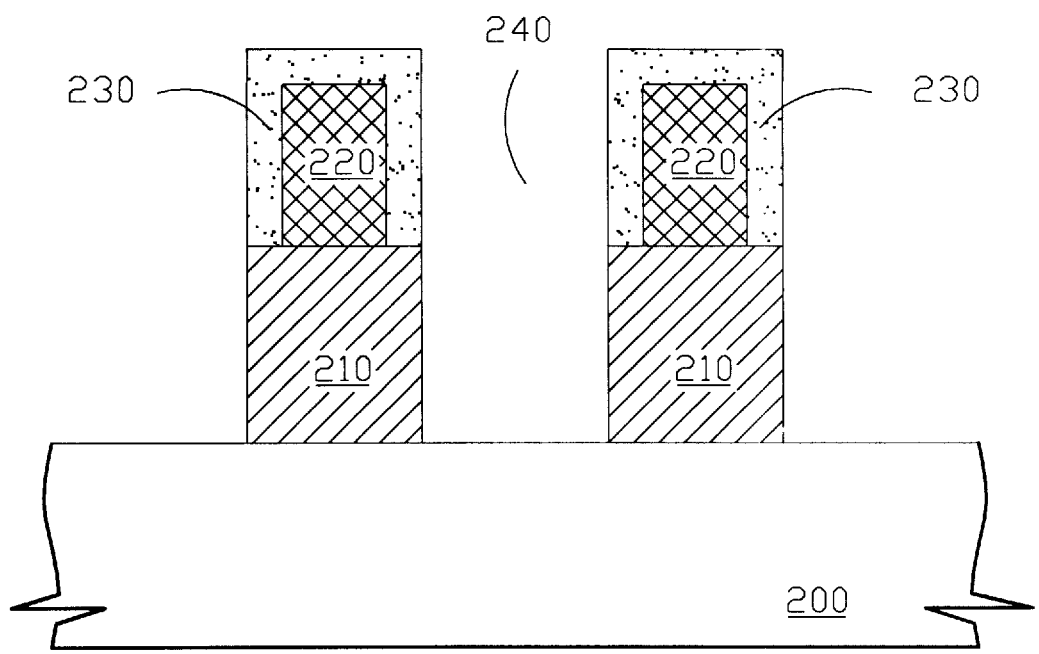
Figure 2C:
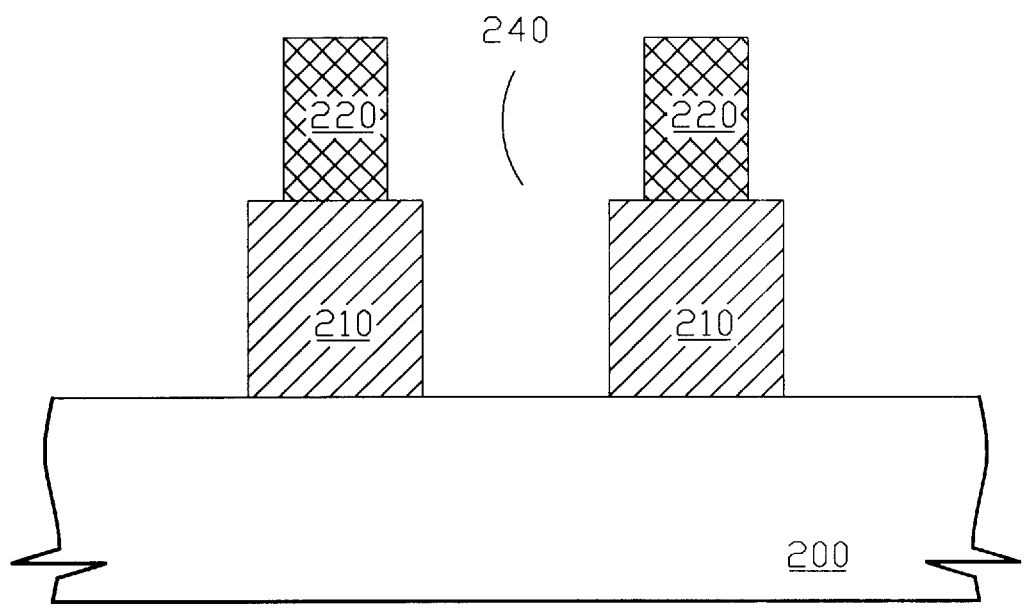
Figure 2D:
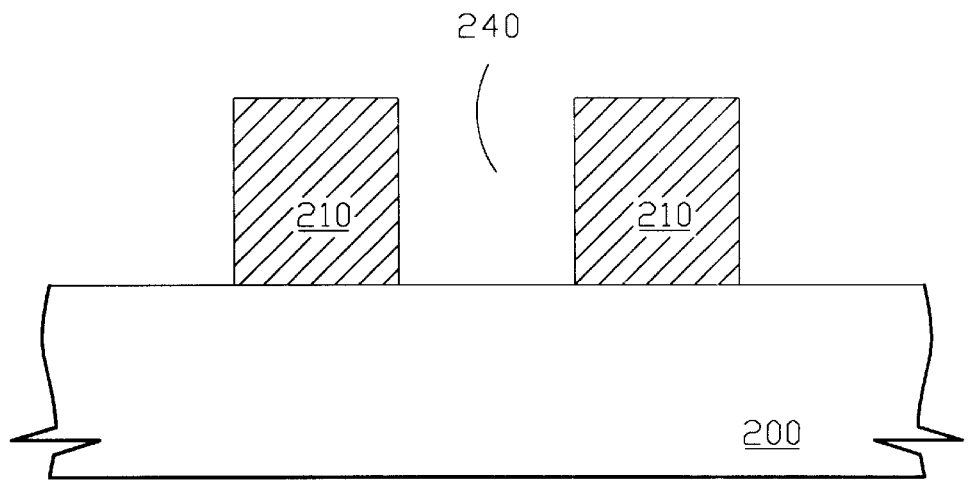

Although specific embodiments have been illustrated and described, it will be obvious to those skilled in the art that various modifications may be made without departing from what is intended to be limited solely by the appended claims.

As illustrated in FIG. 2A to FIG. 2D, in the first embodiment of the present invention, first of all, a semiconductor substrate 200 is provided, and a dielectric layer 210 is formed on the semiconductor substrate 200. Then a photoresist layer 220 is formed and defined on the dielectric layer 210. Afterward, an etching process is performed by way of using the photoresist layer 210 as an etching mask to etch through the dielectric layer 210, so as to form a trench 240 and a polymer layer 230 on the photoresist layer 220. Subsequently, performing a removing process with two steps strips the photoresist layer 220 and the polymer layer 230 thereof, wherein the removing process with two steps comprises a process for stripping the polymer and a process for stripping the photoresist layer. Furthermore, the process for stripping the polymer comprises a mixing gas with a $CF_4$ gas to pre-remove the polymer layer 230 on the photoresist layer 220, and the process for stripping the photoresist layer comprises a mixing gas with a hydrogen gas to keep the profile of the trench 240.

Figure 3A:
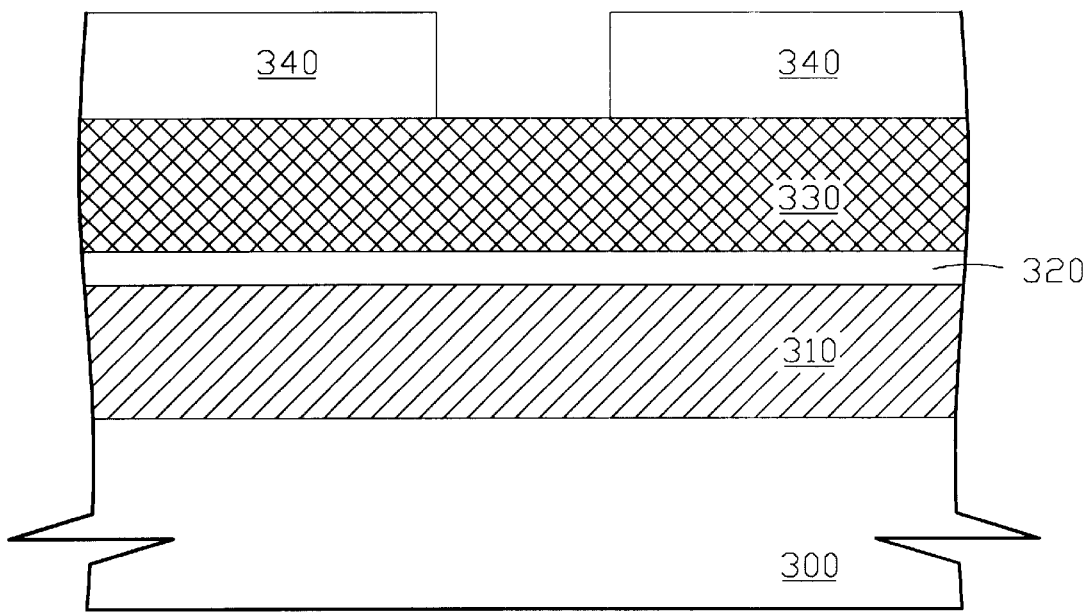
FIGS. 3A to 3E show cross-sectional views illustrative of various stages of the method for forming the dual damascene by way of using the process for removing the photoresist layer with two steps in accordance with the second embodiment of the present invention.
Figure 3B:
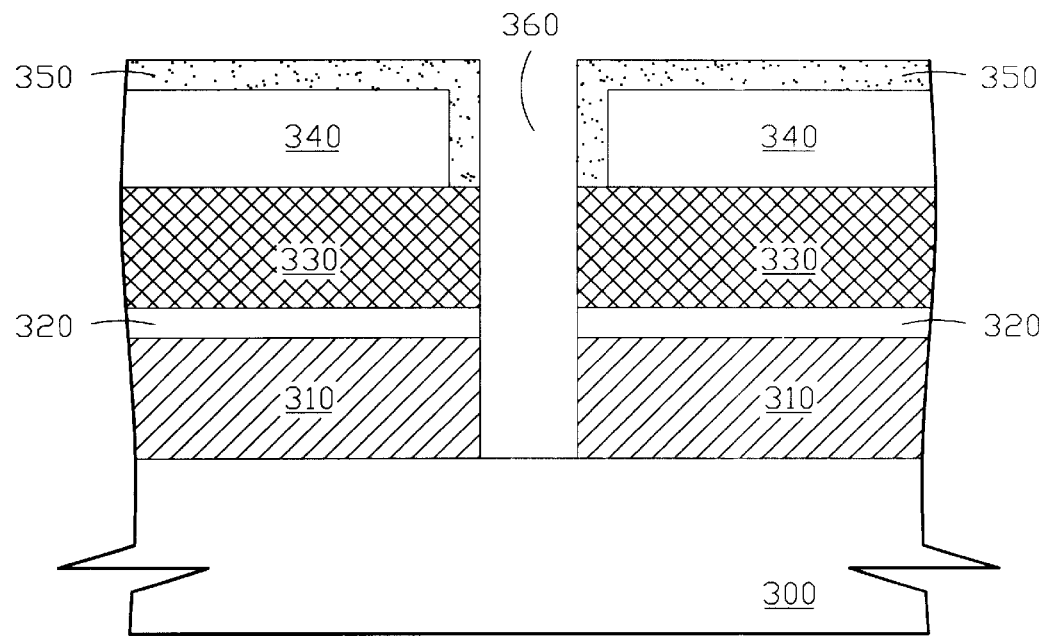

As illustrated in FIG. 3A and FIG. 3B, in the second embodiment of the present invention, first of all, a semiconductor substrate 300 is provided, and a first dielectric layer 310 is formed on the semiconductor substrate 300, an etching stop layer 320 is formed on the first dielectric layer 310 and a second dielectric layer 330 is formed on the etching stop layer 320. In this embodiment, the materials of the first dielectric layer 310 and the second dielectric layer 330 comprise an inorganic low-K material. Then a first photoresist layer 340 is formed on the second dielectric layer 330 and defined the first photoresist layer 340 to form a deep pattern area. Afterward, a dry etching process is performed by way of using the first photoresist layer 340 as an etching mask to etch through the second dielectric layer 330, the etching stop layer 320 and the first dielectric layer 310 in turn, so as to form a via hole 360 and a first polymer layer 350 on the surface of the first photoresist layer 340.

Figure 3C:
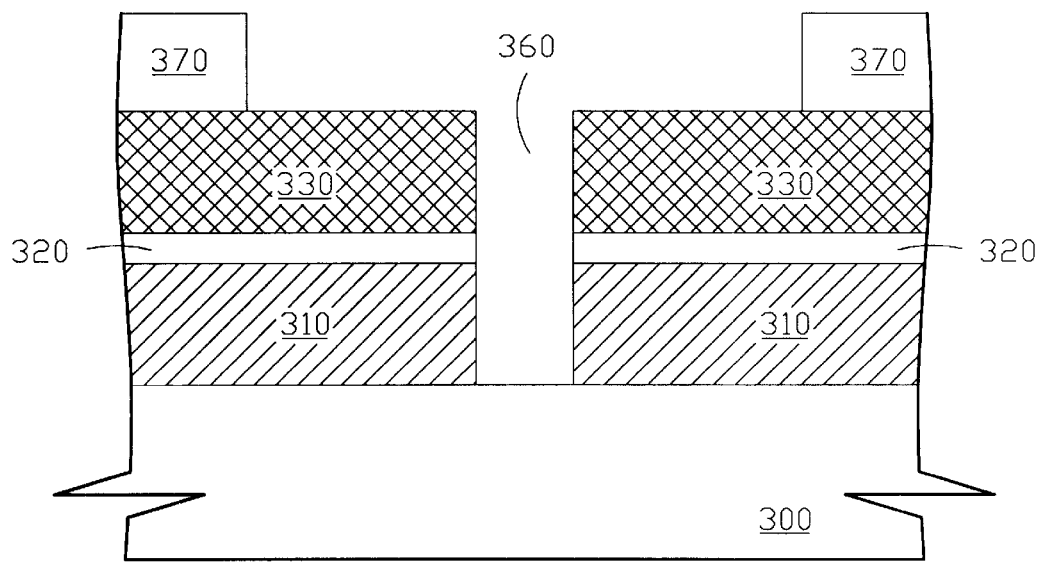
Figure 3D:
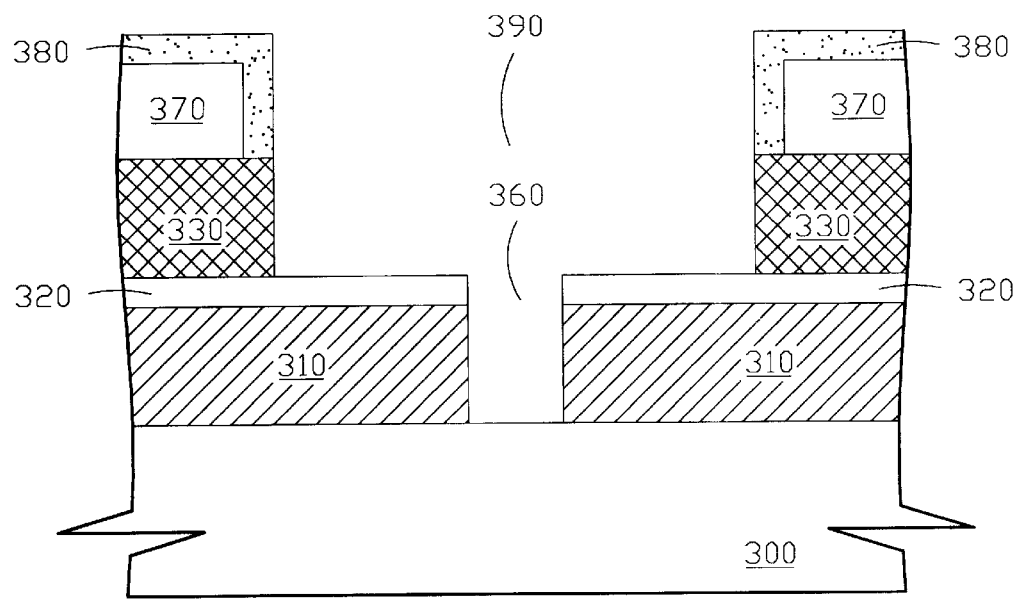
Figure 3E:
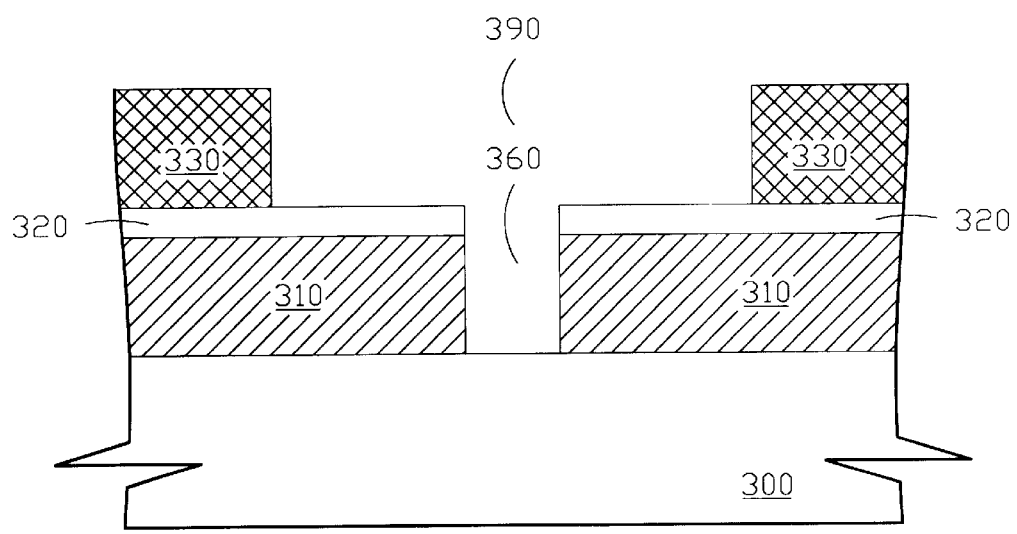

Referring to FIG. 3C and FIG. 3D, in this embodiment, performing a removing process with two steps strips the first photoresist layer 340 and the first polymer layer 350 thereof, wherein the removing process with two steps comprises: firstly, a process for stripping the polymer is -performed to pre-remove the first polymer layer 350 on the first photoresist layer 340, wherein the process for stripping the polymer utilizes a mixing gas with a $CF_4/O_2$ gas to perform an ash process, and the process for stripping the polymer comprises a temperature range is about 30° C. to 60° C.; secondly, a process for stripping the photoresist layer is performed to remove the first photoresist layer 340, wherein the process for stripping the photoresist layer utilizes a mixing gas with a $H_2/O_2$ gas to perform an ash process, and the process for stripping the photoresist layer comprises a temperature range is about 30° C. to 60° C. Then a second photoresist layer 370 is formed on the second dielectric layer 330, and the second photoresist layer 370 is defined to form a shallow pattern area, so as to expose a partial surface of the second dielectric layer 330 and the via hole 360, wherein the shallow pattern area has a larger horizontal size than the deep pattern area. Afterward, another dry etching process is performed by way of using the second photoresist layer 370 as another etching mask and the etching stop layer 320 as an etching terminal point to remove the partial exposed surface of the second dielectric layer 330, so as to form a trench 390 having large horizontal size than the via hole 360 and a second polymer layer 380 on the surface of the second photoresist layer 370. Subsequently, the removing process with two steps is performed again to strip the second photoresist layer 370 and the second polymer layer 380 thereof, so as to form an opening of the damascene, as shown in FIG. 3E.

Figure 4A:
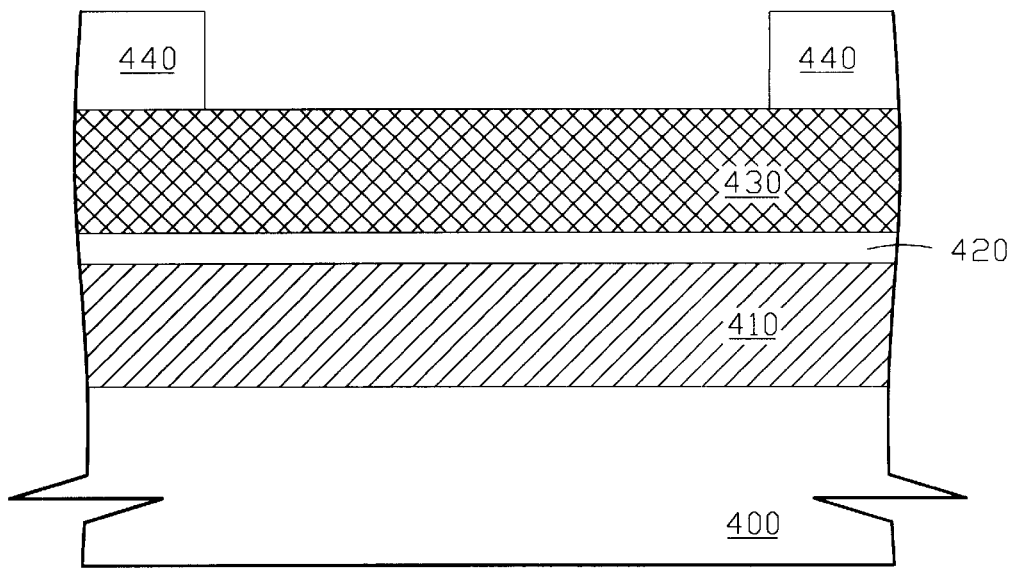
FIGS. 4A to 4E show cross-sectional views illustrative of various stages of the method for forming the dual damascene by way of using the process for removing the photoresist layer with two steps in accordance with the third embodiment of the present invention.
Figure 4B:
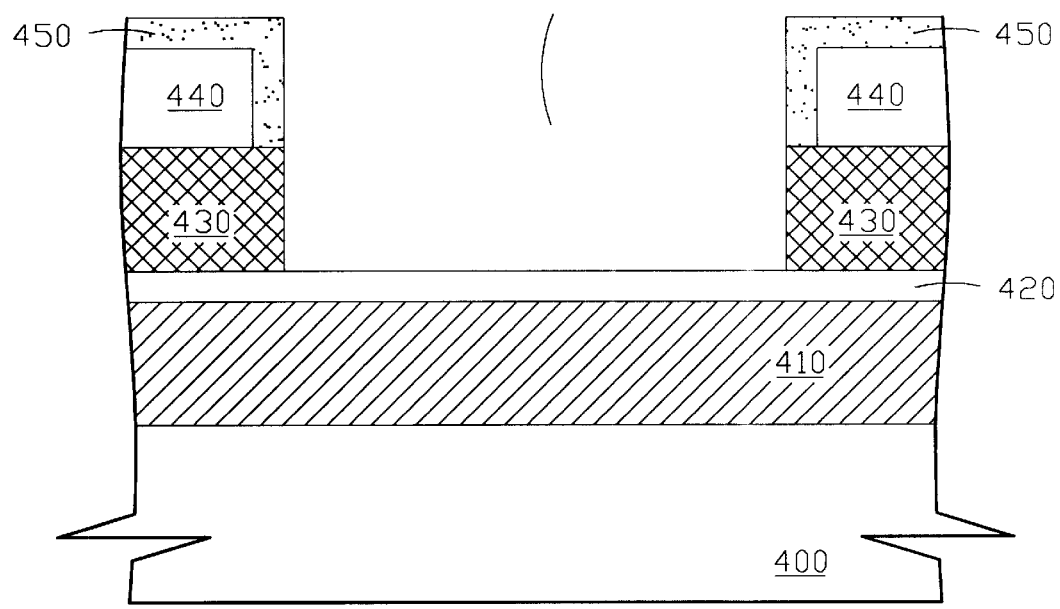

As illustrated in FIG. 4A and FIG. 4B, in the third embodiment of the present invention, first of all, a semiconductor substrate 400 is provided, and a first inorganic dielectric layer 410 is formed on the semiconductor substrate 400, an etching stop layer 420 is formed on the first inorganic dielectric layer 410 and a second inorganic dielectric layer 430 is formed on the etching stop layer 420, wherein the method for forming the first inorganic dielectric layer 410 and the second inorganic dielectric layer 430 comprise a chemical vapor deposition (CVD) Then a first photoresist layer 440 is formed on the second inorganic dielectric layer 430, and the first photoresist layer 440 is defined to form a shallow pattern area and exposure a partial surface of the second inorganic dielectric layer 430. Afterward, a dry etching process is performed by way of using the first photoresist layer 440 as an etching mask and the etching stop layer 420 as an etching terminated point to etch through the second inorganic dielectric layer 430 until the etching stop layer 420, so as to form a trench 460. After finishing the dry etching process, a first polymer layer 450 is formed on the surface of the first photoresist layer 440, wherein the etchant of the dry etching process comprises an organic gas.

Figure 4C:
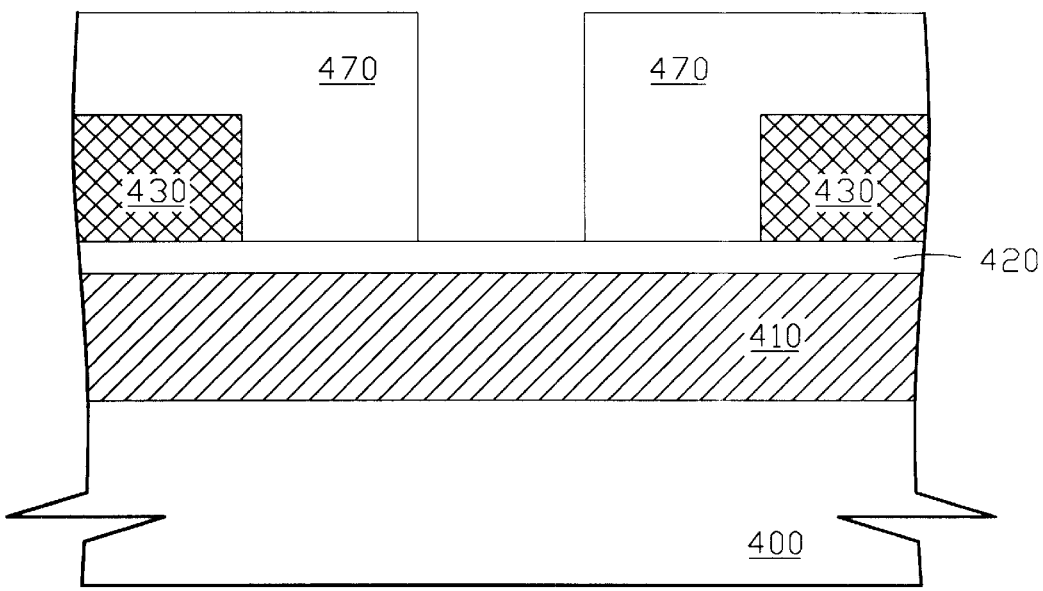
Figure 4D:
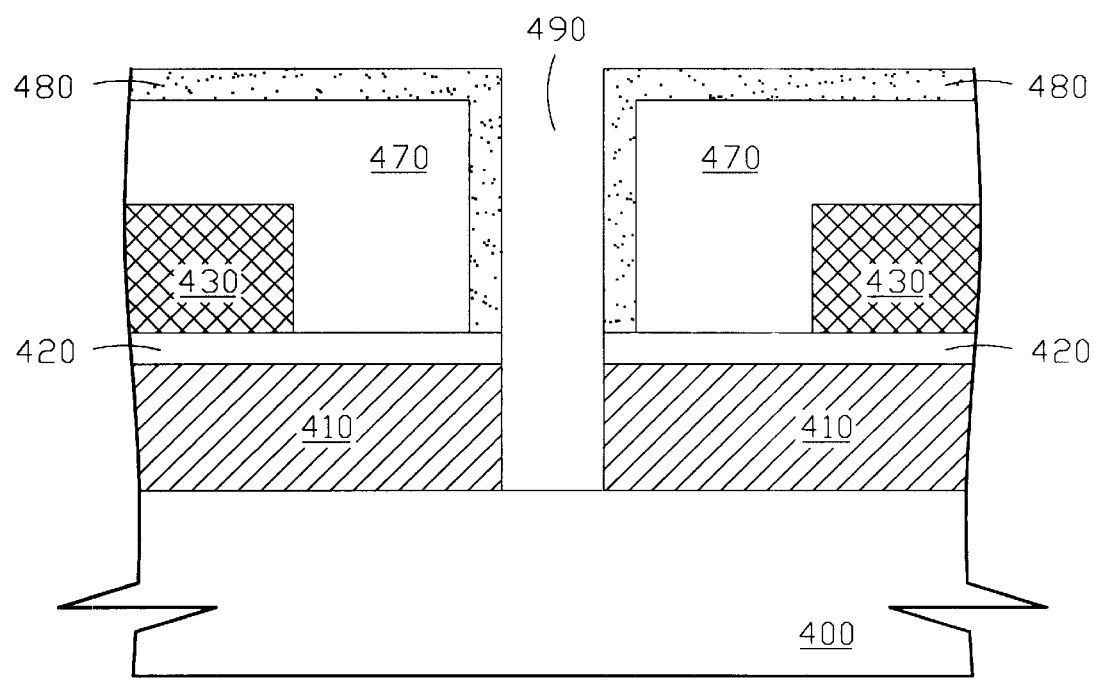
Figure 4E:
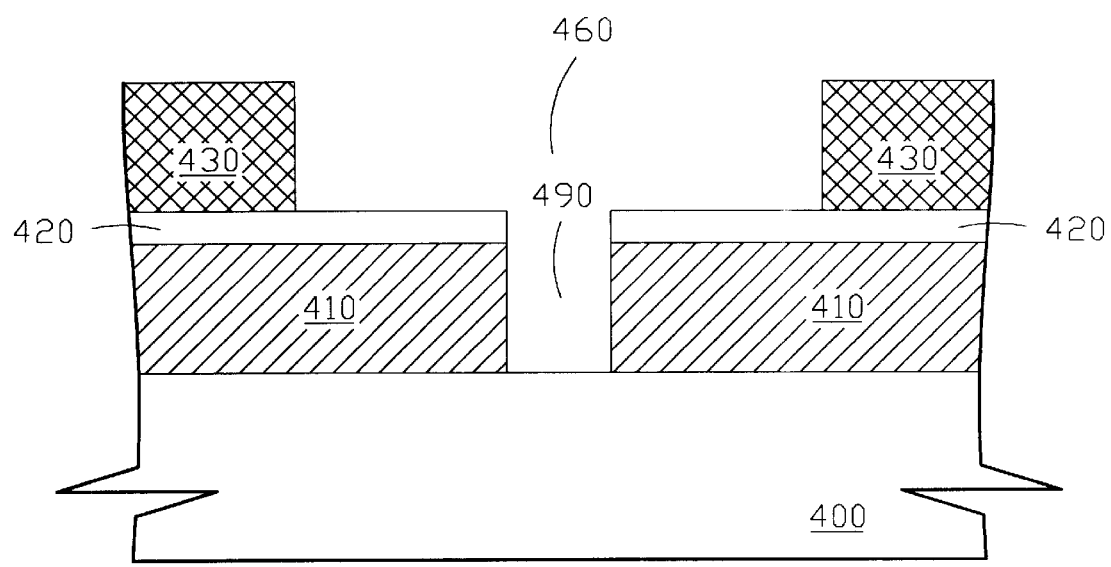

Referring to FIG. 4C and FIG. 4D, in this embodiment, performing a removing process with two steps strips the first photoresist layer 440 and the first polymer layer 450 thereof, wherein the removing process with two steps comprises: firstly, a first ash process is performed by way of using a mixing gas with a $CF_4/O_2$ gas to pre-remove the first polymer layer 450 on the first photoresist layer 440, wherein the first ash process comprises a temperature range about 30° C. to 60° C.; secondly, a second ash: process is performed by way of using a mixing gas with a $H_2/O_2$ gas to remove the first photoresist layer 440, wherein the second ash process comprises a temperature range about 30° C. to 60° C. Then a second photoresist layer 470 is formed on the second inorganic dielectric layer 430, and the second photoresist layer 470 is defined to form a deep patterned area, so as to exposure a partial surface of the etching stop layer 420 in the trench 460, wherein the shallow pattern area has a large horizontal size than the deep pattern area. Afterward, another dry etching process is performed by way of using the second photoresist layer 470 as another etching mask to etch through the etching stop layer 420 and the first inorganic layer 410 in turn until the semiconductor substrate 400, so as to form a via hole 490 having smaller horizontal size than the trench 460. After finishing the dry etching process, a second polymer layer 480 is formed on the surface of the second photoresist layer 470, wherein the etchant of the dry etching process comprises an organic gas. Subsequently, the removing process with two steps is performed again to strip the second photoresist layer 470 and the second polymer layer 480 thereof, so as to form an opening of the damascene, as shown in FIG. 4E.

In these embodiments of the present invention, the present invention can remove the photoresist layer and the polymer residues thereof by a removing process with two steps, so as to avoid remaining the polymer residues and prevent the trench profile from deformation. Furthermore, the removing process with two steps of the present invention utilizes a mixing gas with the $CF_4$ gas to perform an ash process, so as to pre-remove the organic polymer from the surface of the photoresist layer. Then another ash process is performed by way of using another mixing gas with the hydrogen gas to fully remove the photoresist layer. Hence, this invention can effectively raise the quality and the yield of the process, and it also can raise the capability for depositing the followed barrier metal and physical vapor deposition (PVD) process with metal to increase the performance of the device. Therefore, this invention corresponds to economic effect and utilization in industry, and it is appropriate for deep sub-micron technology.

Of course, it is possible to apply the present invention to perform the process for removing the photoresist layer in the damascene process, and to any process for removing the photoresist layer in process of the semiconductor devices. Also, the removing process with two steps of the present invention can be applied to fully strip the photoresist layer concerning the trench used for forming damascene structure has not been developed at present. The method of the present invention is the best process for removing the photoresist layer with two steps for deep sub-micro process.

Obviously, many modifications and variations of the present invention are possible in light of the above teachings. It is therefore to be understood, that within the scope of the appended claims, the present invention may be practiced other than as specifically described herein.

Preferred embodiments of the present invention will now be described in greater detail. Nevertheless, it should be recognized that the present invention can be practiced in a wide range of other embodiments besides those explicitly described, and the scope of the present invention is expressly not limited except as specified in the accompanying claims.

What is claimed is:

1. A method for removing a photoresist layer is used to form a damascene structure, wherein said damascene structure has a first dielectric layer thereon, an etching stop layer on said first dielectric layer, and a second dielectric layer on said etching stop layer, the method comprising:

forming a first photoresist layer on said second dielectric layer and exposing a first pattern area on said second dielectric layer;

performing a first etching process by way of using said first photoresist layer as an etching mask to etch through said second dielectric layer, said etching stop layer and said first dielectric layer until said semiconductor substrate, so as to form a first trench, and forming a first polymer layer on said first photoresist layer after finishing said first etching process;

performing a first removing process to strip said first polymer layer on said first photoresist layer;

performing a second removing process to strip said first photoresist layer;

forming a second photoresist layer on said second dielectric layer and exposing a second pattern area on said second dielectric layer and said first trench;

performing a second etching process by way of using said second photoresist layer as an etching mask and said etching stop layer as an etching terminated point to etch said second dielectric layer until said etching stop layer, so as to form a second trench, and forming a second polymer layer on said second photoresist layer after finishing said second etching process;

performing said first removing process to strip said second polymer layer on said second photoresist layer; and performing said second removing process to strip said second photoresist layer.

2. The method according to claim 1, wherein said first dielectric layer comprises an inorganic low-K material.

3. The method according to claim 1, wherein said second dielectric layer comprises an inorganic low-K material.

4. The method according to claim 1, wherein said first etching process comprises a dry etching process.

5. The method according to claim 1, wherein said first removing process comprises a mixing gas with a $CF_4$ gas.

6. The method according to claim 5, wherein said mixing gas with said $CF_4$ gas comprises an oxygen gas.

7. The method according to claim 1, wherein said first removing process comprises an ash process.

8. The method according to claim 1, wherein the temperature of said first removing process comprises a range about 30° C. to 60° C.

9. The method according to claim 11, wherein said second removing process comprises a mixing gas with a hydrogen gas.

10. The method according to claim 9, wherein said mixing gas with said hydrogen gas comprises an oxygen gas.

11. The method according to claim 1, wherein said second removing process comprises an ash process.

12. The method according to claim 1, wherein the temperature of said second removing process comprises a range about 30° C. to 60° C.

13. The method according to claim 1, wherein said second etching process comprises a dry etching process.

* * * * *